United States Patent [19]
Morenz

[11] Patent Number: 5,117,198
[45] Date of Patent: May 26, 1992

[54] CLASS D MOSFET AMPLIFIER AND VOLTAGE SUPPLY BALANCE CIRCUIT THEREFOR

[76] Inventor: Kenneth Morenz, 2790 Loker Ave., San Diego, Calif. 92008

[21] Appl. No.: 681,367

[22] Filed: Apr. 8, 1991

[51] Int. Cl.⁵ .............................................. H03F 3/217
[52] U.S. Cl. ..................................... 330/251; 330/10; 330/297
[58] Field of Search ..................... 330/10, 202, 207 A, 330/251, 269, 297

[56] References Cited

U.S. PATENT DOCUMENTS 5,023,566 6/1991 El-Hamamsy et al. .............. 330/251

*Primary Examiner*—James B. Mullins
*Attorney, Agent, or Firm*—Frank D. Gilliam

[57] ABSTRACT

The invention is directed to an improved electronic circuit using MOSFET (FET) devices for use in a first embodiment as a class D amplifier and in a second embodiment as a voltage balance circuit for a class D amplifier. In the first embodiment the operating functions of a conventional class D MOSFET amplifier is improved by the addition of a pair of Schottky diodes one of which is connected between the source terminals of the FETs and another connected between the drain terminals of the FETs and the addition of a pair of inductors one connected between the source of one FET and a third inductor and the other connected from the drain of the other FET to the third inductor. The other side of the third inductor provides the output of the class D amplifier. In the second embodiment, the circuit of the first embodiment is converted to a voltage balance circuit by grounding the output end of the first two inductors.

6 Claims, 2 Drawing Sheets

CLASS D MOSFET AMPLIFIER AND VOLTAGE SUPPLY BALANCE CIRCUIT THEREFOR

BACKGROUND OF THE INVENTION

The invention is directed to amplifiers of the Pulse width modulated (PWM) type and more particularly to improved long life Metal-Oxide Semiconductor Field-effect transistors (MOSFET) used in class D Amplifiers.

Prior art PWM amplifiers such as, amplifier 10, shown in the prior art FIG. 1, the MOSFETs (12A and 12B) are found to have a very short operational life due to an inherent internal clamping diode (14A and 14B) incorporated in the construction of a MOSFET. The MOSFET internal clamp diode is connected from source to drain as shown. The typical MOSFETs shown are IRF 240 devices or equivalent. The amplifier input, MOSFET elements and ground connections, capacitors C1, C2 and C3, inductance L1 and speaker 16 are conventional components of a typical PJM output stage. The internal clamp diode causes a problem in that it is to slow to efficiently accommodate desirable PWM switching speeds for a stereo audio amplifier which require switching rates in the range of 400 khz.

The problem caused by the internal clamping diode becomes apparent when very fast rise times are used to switch between the pair of MOSFET devices to obtain efficient stereo audio amplification. Typical switching rates for quality audio power applications are several hundred kilohertz (KHZ) and above. Switch rise times in the order of 20 nanoseconds (NS) are required to provide the necessary efficiencies for stereo audio operation. The clamp diode has the characteristic of a relatively slow decay time typically about 600 NS. When there is no audio signal applied to the amplifier, the current through inductor L1 is a symmetrical triangular waveform with an average low frequency component of zero. As the audio signal is increased the current wave form through inductor L1 becomes unsymmetrical in proportion to the audio wave form. The current flowing in the output coil (L1) is a composite of the audio current, and the inductor L1 magnetizing current. When this composite current minimum is greater than zero, current is still flowing in the diode 14B when MOSFET 12A switches on or current is still flowing in diode 14A when MOSFET 12B switches on. The large reverse recovery current is destructive to the MOSFETs and is additionally destructive because of the high peak reverse voltage spikes present.

The current into inductor L1 will build up until the minimum instantaneous composite current will always exceed 0 amps.

During the switched off part of the cycle when Vb is more minus than the B− supply, current will flow back into capacitor C2 through diode 14B. This current will continue to increase the voltage on capacitor C2 until the composite current waveform has approached 0 amps.

The result of this current (particularly at low modulation frequencies) causes a power supply unbalance by increasing the magnitude of B−. This causes a distortion in the output audio wave form and additionally can create a destructive voltage across capacitor C2. The same effect occurs when negative current is flowing into the load, causing B+ to rise in magnitude.

There has not been a successful MOSFET class D audio amplifier or a successful solution to the power supply unbalance created by a class D MOSFET audio amplifier until the emergence of the instant invention.

SUMMARY OF THE INVENTION

The invention is directed to an improved class D audio amplifier employing MOSFETs and a voltage balance control circuit to maintain a balance between B+ and B− supply of an operating class D amplifier from a regulated power supply.

The improvement comprises the external connecting of a Schottky diode between the source elements of a pair of MOSFETs and a second Schottky diode between the drains of the pair of MOSFETs with the anodes connected to one MOSFET and the cathodes connected to the other MOSFET and adding a second inductor between the source terminal of a first MOSFET and a first inductor and a third inductor from the drain terminal of the second MOSFET to the first inductor.

The voltage balance circuit comprises a pair of MOSFETs driven by a squarewave signal from a conventional flip-flop signal source. The voltage balance circuit is similar to the amplifier circuit described above except that the second and third inductors are connected to ground potential instead of the amplifier output.

The addition of the Schottky diodes and inductors to the MOSFETs of the class D amplifier circuit eliminates the problems present in the prior art Class D amplifiers using MOSFETs and the addition of the MOSFET balance circuit to the power supply of the class D amplifier circuit eliminates distortion due to regulated voltage supply level changes during amplifier operation.

An object of this invention is to improve the life of MOSFETs used as class D amplifiers.

Another object of this invention is to provide a distortion free class D amplifier for stereo audio operation.

Yet another object of this invention is to provide a voltage supply balance circuit for a Class D amplifier of the MOSFET type.

Other objects and features of the invention will become apparent as the drawings which follow are understood by reading the corresponding description thereof.

DESCRIPTION OF THE PREFERRED EMBODIMENT

Figure 1:
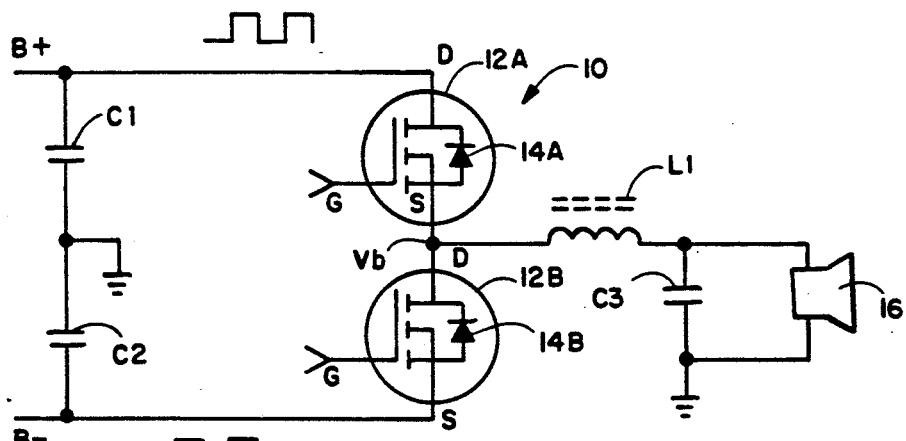
FIG. 1 is a schematic showing of a typical prior art PMW output stage of a class D amplifier utilizing MOSFETS.

FIG. 1 depicts a prior art class D PJM output amplifier stage 10 using a pair of MOSFETs 12A and 12B of the type 1RF240 or equivalent. B+ and B− are supplied from a conventional regulated source (see FIG. 4). The inputs to the drain (D) and source (S) terminals of the MOSFETs include capacitors Cl and C2 each with a typical value of 700 micro farads ($\mu f$) connected from B+ and B− respectfully for the purpose of bypassing to ground potential. The inputs signal to gate (G) terminals of the MOSFETs is shown as a pulse width modulated square wave converted from an audio input source (see FIG. 4). Each MOSFET, indicated as 12A and 12B, contains an inherent clamp diode between the source (S) and drain connections indicated as 14A and 14B. The source terminal S of MOSFET 12A and the drain terminal D of MOSFET 12B are connected at location Vb to one side of a conventional series inductor L1 of 10 Micro Henrys (μH). The opposite side of inductor L1 is connected to a load 16. A capacitor C3 of 0.2 μf is connected from the high side of the load to ground potential. The operation of the prior art amplifier 10 as briefly discussed above is well known in the art.

Figure 2:
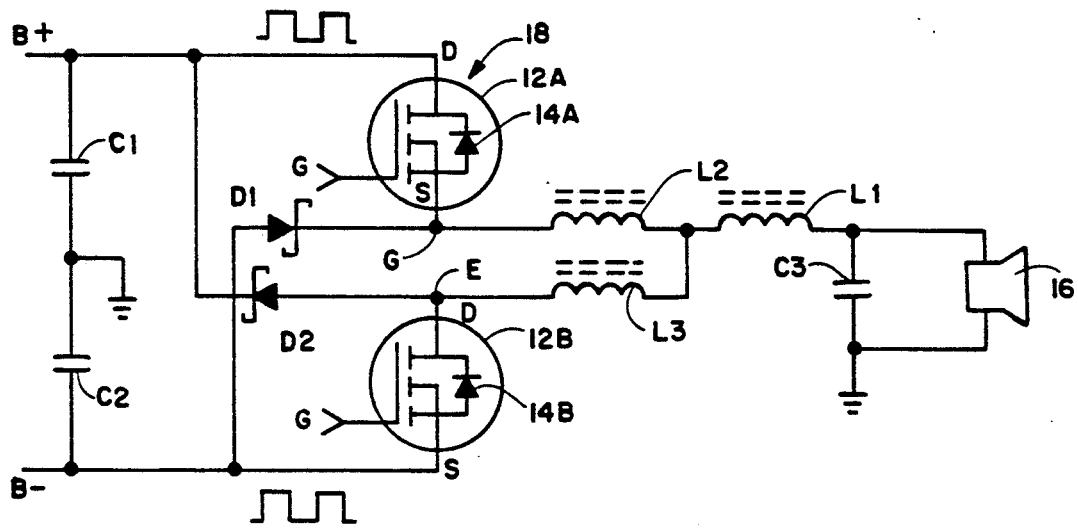
FIG. 2 is a schematic showing the improved PMW output stage of a class D amplifier.

Referring now to FIG. 2 which depicts a stereo class D PWM amplifier 18 utilizing the improvements of the present invention adapted to the prior art class D amplifier 10.

The circuit of drawing FIG. 2 is substantially the same as drawing FIG. 1, prior art, discussed above except that an external Schottky diode D1 of the type-16CTQ100 or equivalent has its cathode connected to the source terminal S of MOSFET 12A and its anode connected to the source terminal S of MOSFET 12B and a similar Schottky diode D2 has its anode connected to the drain terminal D of MOSFET 12B and its cathode connected to the drain terminal D off MOSFET 12A. A second inductor L2 of 2 micro henrys (μh) is connected at one end to the common connection of the source terminal S of MOSFET 12A and the cathode of diode D1, and or the other end to input of the inductor L1. A third inductor L3 of the same type as inductor L2 is connected between the common connection of the drain of MOSFET 12B and anode of diode D2 and the input of the inductor L1.

In operation during the first half cycle, 1l is connected as shown to prevent 14B from conducting. The inductor L2 forms an inductive divider between point E and the source connection of MOSFET 12A. At the negative switching instant the negative going voltage is clamped to B−. The voltage drop across L2 forms a voltage divider with L1 keeping the voltage at Ed higher than B−. This keeps point E at a voltage that is always more positive than B− which keeps 14B from ever conducting solving the shorting problem as described above. In a like manner D2 performs the same function operating with L3 during the other half cycle.

Figure 3:
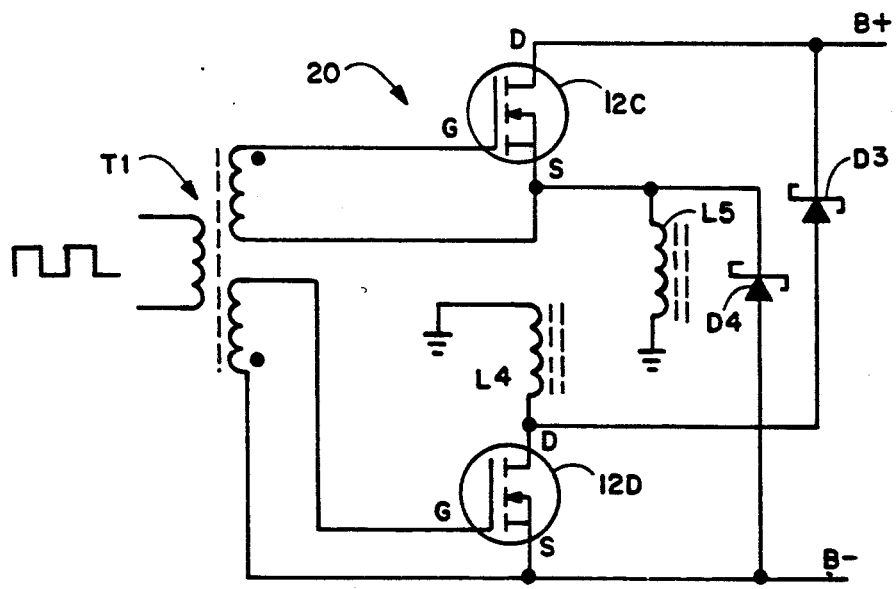
FIG. 3 is a schematic showing of the regulated power supply balance circuit of the invention.

FIG. 3 depicts the schematic diagram of the above circuit utilized as a voltage balance circuit 20 in a class D amplifier being powered by a conventional regulated power supply supplying B+ and B− to the MOSFETs. The differences in this circuit as compared to the circuit of FIG. 2 are the supplying of a phased 50% duty cycle square wave signal to the gates of the MOSFETs 12C and 12D from a phase inverting transformer T1, well known in the art, and the grounding of the inductors L5 and L4 each of 220 mh.

The circuit operates as follows. The driving waveform at the input of transformer T1 is a 50% duty cycle squarewave as shown. Other than 50% duty cycle will maintain an undesirable fixed offset between the supply voltages to the MOSFETs. When the B− supply goes more negative because of the unbalanced composite current in L1 of drawing FIG. 2, the unbalanced energy is stored in L4 of drawing FIG. 3 and when the driving signal switches MOSFET 12D to the off state the energy stored in L4 of drawing FIG. 3 is transferred through Schottky diode D3 to the B+ supply. The B− voltage is maintained at a constant level in this manner. Similarly, if B+ goes high, energy is stored in L5 and transfers through D4 to B−. The regulator maintains 140 V from B+ to B− (no reference to ground). If B-rises in magnitude, B+ will drop.

Figure 4:
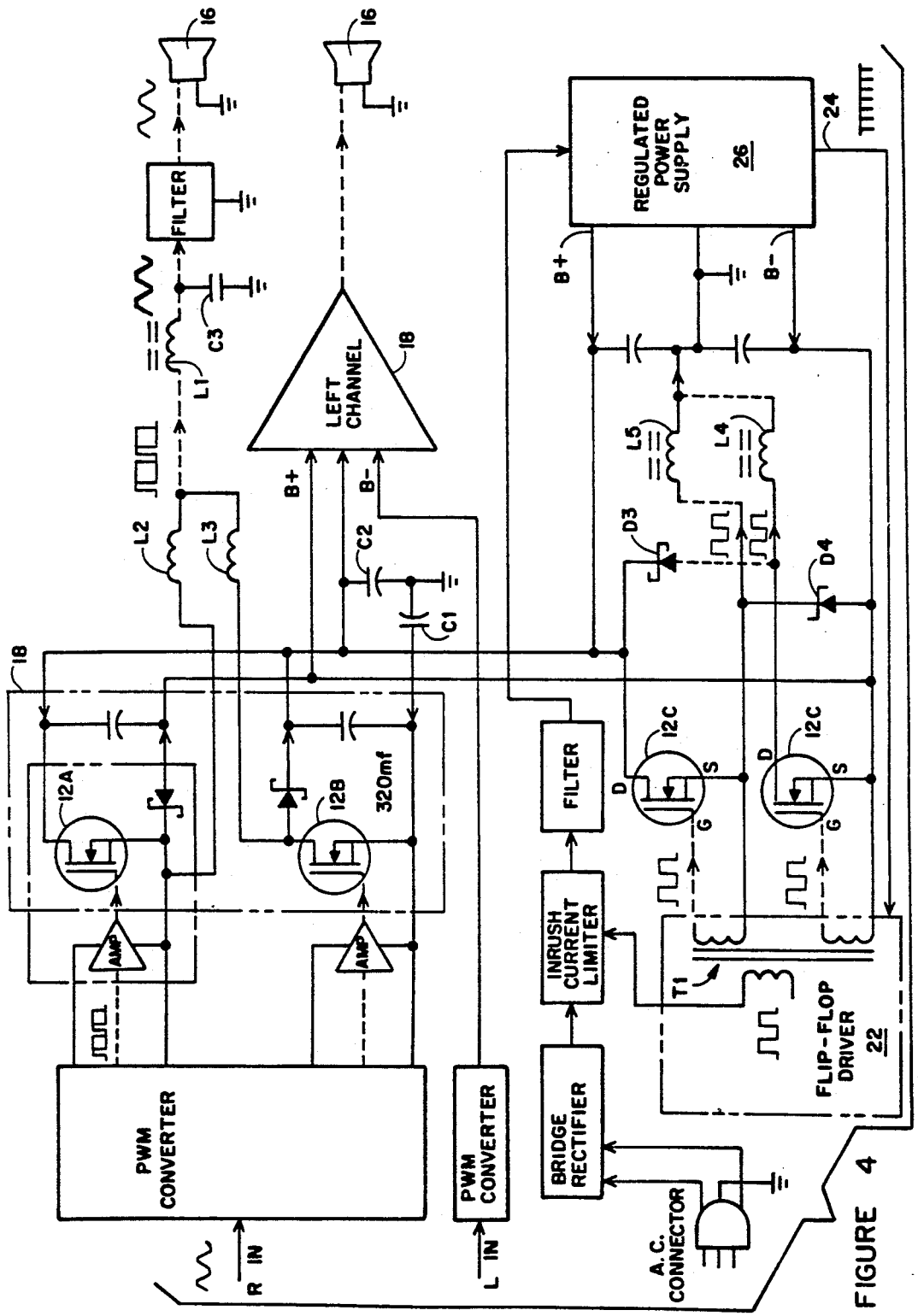
FIG. 4 is a schematic showing of a circuit employing the first and second embodiments of the invention.

Drawing FIG. 4 depicts a two channel stereo class D amplifier employing the circuits of FIG. 2 and 3.

The flip-flop driver 22 is controlled by a pulse output 24 from the regulated power supply 26 to maintain the 50% duty cycle for the balance circuit 20.

The Schottey diodes have zero reverse recovery time and are therefore perfectly suited for use with these extremely fast MOSFETs. The three coil output stage in the amplifier creates the inductive divider to prevent the MOSFET internal diodes from conducting and the separate coils in the voltage balance circuit isolate one MOSFET diode stage from the other absolutely. Further, the voltage balance circuit actually draws energy from one supply and transfers it to the other unlike tracking power supplies which simply increase the voltage of one supply bus to match the other.

While a specific embodiment of class D stereo MOSFET amplifier and voltage balance circuit has been shown and fully explained above for the purpose of illustration it should be understood that many alterations, modifications and substitutions may be made to the instant invention disclosure without departing from the spirit and scope of the invention as defined by the appended claims.

What is claimed is:

1. A class D amplifier audio output stage comprising:
    A source of B+ and B− voltages with respect to a ground potential:
    a first and second MOSFET device each having a source, drain and gate elements, said B+ being connected to the drain element of said first MOSFET device and said B− being connected to the source element of said second MOSFET device:
    a first, second and third inductance having first and second ends, said first inductance being connected at said first end to said source element of said first MOSFET device and said second end of said first inductance connected to the first end of said third inductance and said first end of said second inductance connected to the drain element of said second MOSFET device and the second end of said second inductance being connected to said first end of said third inductance:
    a pair of Schottky diodes each having an anode and cathode, element, said cathode element of a first Schottky diode of said pair being connected to said source element of said first MOSFET device and said anode element of said first Schottky diode, being connected to said source element of said second MOSFET and the anode element of a second Schottky diode of said pair being connected to the drain element of said second MOSFET and said cathode of said second Schottky diode being connected to said drain element of said first MOSFET device: and
    a load being connected to said second end of said third inductance.

2. The class D amplifier of claim 1 additionally comprising:
    a voltage balance circuit for preventing said B− voltage from increasing above a predetermined level of magnitude during operation of said class D amplifier and B+ increasing above a predetermined level of magnitude, said voltage balance circuit comprising, a third and fourth MOSFET device having source, gate and drain elements, a source of 50% duty cycle squarewave signals, a phase inverting transformer having a primary winding connected to said source of 50% duty squarewave signals and a first and second phase shift secondary winding, said first secondary winding having a first end connected to said gate element of said third MOSFET device and the other end of said first secondary winding being connected to said source element of said third MOSFET device and said second secondary having one end connected to the gate element of said fourth MOSFET device and the other end of said second secondary being connected to the source element of said fourth MOSFET device, said first and second secondary windings provide 180 degree phase shifted inputs to their respective MOSFET devices, the drain element of said third MOSFET device is connected to said B+ voltage and the source element of said fourth MOSFET device is connected to said B-voltage, a fourth and fifth inductance having first and second ends, said fourth inductor having said first end connected to the source element of said third MOSFET device and said first end of said fifth inductance being connected to the drain element of said fourth MOSFET device and the second ends of said fourth and fifth inductances being connected to said ground potential, and a third and fourth Schottky diode each having cathode and anode elements, said cathode element of said third Schottky diode connected to said source element of said third MOSFET device and the anode element of said third Schottky diode being connected to B− voltage, said cathode element of said fourth Schottky diode being connected to said B+ voltage and said anode element of said fourth Schottky diode being connected to drain element of said fourth MOSFET device.

3. The class D amplifier and voltage balance of claim 2 wherein said MOSFET devices are IRF240 MOSFET devices and said Schottky diodes are of the I6CTQIOO type.

4. The class D amplifier of claim 1 wherein said MOSFET devices are 1 RF240 MOSFET devices and said Schottky diodes are of the 16CTQ100 type.

5. A voltage balance circuit for a class D amplifier comprising:

A source of B+ and B− voltages with a predetermined voltage difference with reference to a ground potential:

a first and second MOSFET device having source, gate and drain elements:

a source of 50% duty squarewave signals:

a phase inverting transformer having a primary winding connected to said source of 50% duty squarewave signals and a first and second phase shift secondary winding, said first secondary winding having a first end connected to said gate element of said first MOSFET device and the other end of said first secondary winding being connected to said source element of said first MOSFET device and said second secondary having one end connected to the gate element of said second MOSFET device and the other, end of said second secondary being connected to the source element of said second MOSFET device, said first and second secondary windings provide 180 degree phase shifted inputs to their respective MOSFET devices:

the drain of said first MOSFET device is connected to said B+ voltage and the source element of said second MOSFET device is connected to said B− voltage:

a first and second inductance each having first and second ends, said first inductor having said first end connected to the source element of said first MOSFET device and said first end of said second inductance being connected to the drain element of said second MOSFET device and the second ends of said first and second inductances being connected to said ground potential: and a first and second Schottky diode each having cathode and anode elements, said cathode element of said first Schottky diode connected to said source element of said first MOSFET device and the anode element of said first Schottky diode being connected to B− voltage, said cathode element of said second Schottky diode being connected to said B+ voltage and said anode element of said second Schottky diode being connected to said drain element of said second MOSFET device whereby the predetermined B+ and B− voltage difference is maintained.

6. The voltage balance of claim 5 wherein said MOSFET devices are IRF240 MOSFET devices and said Schottky diodes are of the I6CTQIOO type.

* * * * *